US007667968B2

(12) United States Patent
Moorer et al.

(10) Patent No.: US 7,667,968 B2
(45) Date of Patent: Feb. 23, 2010

(54) AIR-COOLING SYSTEM CONFIGURATION FOR TOUCH SCREEN (75) Inventors: Seale Moorer, Westerville, OH (US); Eric Eichensehr, Westerville, OH (US); William K. Virgin, Westerville, OH (US); Joseph Lehman, New Albany, OH (US)

(73) Assignee: Exceptional Innovation, LLC, Westerville, OH (US)

( * ) Notice: Subject to any disclaimer, the term of this patent is extended or adjusted under 35 U.S.C. 154(b) by 189 days.

(21) Appl. No.: 11/751,582

(22) Filed: May 21, 2007

(65) Prior Publication Data
US 2007/0268667 A1 Nov. 22, 2007

Related U.S. Application Data (60) Provisional application No. 60/747,726, filed on May 19, 2006.

(51) Int. Cl.
H05K 7/20 (2006.01)
F28F 7/00 (2006.01)

(52) U.S. Cl. ............... 361/697; 361/694; 361/695; 361/704; 248/917; 312/7.2; 312/242; 52/27; 52/220.1; 165/80.3

(58) Field of Classification Search ............ 361/679.02, 361/679.21, 679.26–679.27, 679.3, 679.46, 361/679.48–679.51, 690, 694–695, 697, 361/703–704; 165/80.3; 174/16.1; 248/917–924; 454/184; 312/7.2, 242; 40/781; 52/27, 220.1
See application file for complete search history.

(56) References Cited

U.S. PATENT DOCUMENTS

| 4,567,557 A | 1/1986 | Burns |
| 4,808,841 A | 2/1989 | Ito et al. |
| 4,989,081 A | 1/1991 | Miyagawa |
| 5,086,385 A | 2/1992 | Launey et al. |
| 5,105,186 A | 4/1992 | May |
| 5,218,552 A | 6/1993 | Stirk |
| 5,237,305 A | 8/1993 | Ishikuro et al. |
| 5,410,373 A * | 4/1995 | Sagues et al. ............... 348/825 |
| 5,502,618 A * | 3/1996 | Chiou ........................ 361/695 |
| 5,579,221 A | 11/1996 | Mun |
| 5,598,523 A | 1/1997 | Fujita |
| 5,621,662 A | 4/1997 | Humphries et al. |
| 5,623,392 A * | 4/1997 | Ma ........................ 361/679.22 |
| 5,666,172 A | 9/1997 | Ida et al. |
| 5,706,191 A | 1/1998 | Bassett et al. |
| 5,706,290 A | 1/1998 | Shaw et al. |
| 5,748,444 A | 5/1998 | Honda et al. |
| 5,787,259 A | 7/1998 | Haroun |
| 5,831,823 A * | 11/1998 | Hoedl ........................ 361/695 |
| 5,850,340 A | 12/1998 | York |
| 5,877,957 A | 3/1999 | Bennett |
| 5,922,047 A | 7/1999 | Newlin et al. |

(Continued)

Primary Examiner—Jayprakash N Gandhi
Assistant Examiner—Robert J Hoffberg
(74) Attorney, Agent, or Firm—McGuireWoods LLP (57) ABSTRACT A cooling system for an electrical device includes a receptacle unit having a main opening with an inner chamber, a cooling unit operably associated with the electrical device arranged in the chamber of the receptacle unit, intake and exhaust openings arranged between the electronic device and the receptacle unit, an intake path extending from the intake opening to the cooling unit via the chamber of the receptacle unit and an exhaust path extending from the cooling unit to the exhaust opening via the inner space of the receptacle unit.

30 Claims, 5 Drawing Sheets

U.S. PATENT DOCUMENTS

| | | | |
|---|---|---|---|
| 5,956,025 A | 9/1999 | Goulden et al. | |
| 6,020,881 A | 2/2000 | Naughton et al. | |
| 6,029,092 A | 2/2000 | Stein | |
| 6,061,602 A | 5/2000 | Meyer | |
| 6,112,127 A | 8/2000 | Bennett | |
| 6,139,177 A | 10/2000 | Venkatraman et al. | |
| 6,147,601 A | 11/2000 | Sandelman et al. | |
| 6,154,681 A | 11/2000 | Drees et al. | |
| 6,160,477 A | 12/2000 | Sandelman et al. | |
| 6,175,872 B1 | 1/2001 | Neumann et al. | |
| 6,182,094 B1 | 1/2001 | Humpleman et al. | |
| 6,192,282 B1 | 2/2001 | Smith et al. | |
| 6,198,479 B1 | 3/2001 | Humpleman et al. | |
| 6,201,523 B1 | 3/2001 | Akiyama et al. | |
| 6,222,729 B1 | 4/2001 | Yoshikawa | |
| 6,243,707 B1 | 6/2001 | Humpleman et al. | |
| 6,263,260 B1 | 7/2001 | Bodmer et al. | |
| 6,275,922 B1 | 8/2001 | Bertsch | |
| 6,278,676 B1 | 8/2001 | Anderson et al. | |
| 6,288,716 B1 | 9/2001 | Humpleman et al. | |
| 6,313,990 B1 | 11/2001 | Cheon | |
| 6,314,326 B1 | 11/2001 | Fuchu | |
| 6,353,853 B1 | 3/2002 | Gravlin | |
| 6,385,495 B1 | 5/2002 | Bennett | |
| 6,389,331 B1 | 5/2002 | Jensen et al. | |
| 6,402,109 B1 | 6/2002 | Dittmer | |
| 6,405,103 B1 | 6/2002 | Ryan et al. | |
| 6,456,892 B1 | 9/2002 | Dara-Abrams et al. | |
| 6,462,654 B1 | 10/2002 | Sandelman et al. | |
| 6,473,661 B1 | 10/2002 | Wollner | |
| 6,480,243 B2 * | 11/2002 | Yamamoto | 348/836 |
| 6,496,575 B1 | 12/2002 | Vasell et al. | |
| 6,522,346 B1 | 2/2003 | Meyer | |
| 6,523,696 B1 | 2/2003 | Saito et al. | |
| 6,526,581 B1 | 2/2003 | Edson | |
| 6,546,419 B1 | 4/2003 | Humpleman | |
| 6,580,950 B1 | 6/2003 | Johnson et al. | |
| 6,587,739 B1 | 7/2003 | Abrams et al. | |
| 6,609,038 B1 | 8/2003 | Croswell et al. | |
| 6,615,088 B1 | 9/2003 | Myer et al. | |
| 6,633,781 B1 | 10/2003 | Lee et al. | |
| 6,640,141 B2 | 10/2003 | Bennett | |
| 6,663,781 B1 | 12/2003 | Huling | |
| 6,690,411 B2 | 2/2004 | Naidoo et al. | |
| 6,690,979 B1 | 2/2004 | Smith | |
| 6,735,619 B1 | 5/2004 | Sawada | |
| 6,756,998 B1 | 6/2004 | Bilger | |
| 6,763,040 B1 | 7/2004 | Hite et al. | |
| 6,778,868 B2 | 8/2004 | Imamura et al. | |
| 6,782,294 B2 | 8/2004 | Reich et al. | |
| 6,792,319 B1 | 9/2004 | Bilger | |
| 6,792,323 B2 | 9/2004 | Krzyzanowski et al. | |
| 6,792,480 B2 * | 9/2004 | Chaiken et al. | 710/14 |
| 6,823,223 B2 | 11/2004 | Gonzales et al. | |
| 6,834,208 B2 | 12/2004 | Gonzales et al. | |
| 6,838,978 B2 | 1/2005 | Aizu et al. | |
| 6,845,275 B2 | 1/2005 | Gasiorek et al. | |
| 6,850,149 B2 | 2/2005 | Park | |
| 6,859,669 B2 | 2/2005 | An | |
| 6,865,428 B2 | 3/2005 | Gonzales et al. | |
| 6,868,292 B2 | 3/2005 | Ficco | |
| 6,868,293 B1 | 3/2005 | Schurr et al. | |
| 6,870,555 B2 | 3/2005 | Sekiguchi | |
| 6,891,838 B1 | 5/2005 | Petite | |
| 6,912,429 B1 | 6/2005 | Bilger | |
| 6,924,727 B2 | 8/2005 | Nagaoka et al. | |
| 6,928,576 B2 | 8/2005 | Sekiguchi | |
| 6,930,599 B2 | 8/2005 | Naidoo et al. | |
| 6,957,110 B2 | 10/2005 | Wewalaarachchi et al. | |
| 6,957,275 B2 | 10/2005 | Sekiguchi | |
| 6,961,763 B1 | 11/2005 | Wang et al. | |
| 6,965,935 B2 | 11/2005 | Diong | |
| 6,967,565 B2 | 11/2005 | Lingermann | |
| 6,980,868 B2 | 12/2005 | Huang et al. | |
| 6,990,379 B2 | 1/2006 | Gonzales et al. | |
| 7,047,092 B2 | 5/2006 | Wimsatt | |
| 7,143,599 B2 * | 12/2006 | Wo | 62/259.2 |
| 7,170,422 B2 | 1/2007 | Nelson et al. | |
| 7,175,152 B2 * | 2/2007 | Dittmer | 248/221.11 |
| 7,201,356 B2 * | 4/2007 | Huang | 248/309.1 |
| 7,203,486 B2 | 4/2007 | Patel | |
| 7,380,250 B2 | 5/2008 | Schechter et al. | |
| 7,453,685 B2 * | 11/2008 | Lube | 361/679.27 |
| 2001/0034754 A1 | 10/2001 | Elwahab et al. | |
| 2001/0036192 A1 | 11/2001 | Chiles et al. | |
| 2001/0039460 A1 | 11/2001 | Aisa | |
| 2002/0000092 A1 | 1/2002 | Sharood et al. | |
| 2002/0016639 A1 | 2/2002 | Smith | |
| 2002/0029085 A1 | 3/2002 | Park | |
| 2002/0031120 A1 | 3/2002 | Rakib | |
| 2002/0033760 A1 | 3/2002 | Kobayashi | |
| 2002/0035404 A1 | 3/2002 | Ficco et al. | |
| 2002/0044042 A1 | 4/2002 | Christensen | |
| 2002/0047774 A1 | 4/2002 | Christensen | |
| 2002/0111698 A1 | 8/2002 | Graziano et al. | |
| 2002/0126443 A1 * | 9/2002 | Zodnik | 361/683 |
| 2002/0152311 A1 | 10/2002 | Veltman et al. | |
| 2002/0165953 A1 | 11/2002 | Diong | |
| 2002/0180579 A1 | 12/2002 | Nagaoka et al. | |
| 2002/0194328 A1 | 12/2002 | Hallenbeck | |
| 2002/0196158 A1 | 12/2002 | Lee | |
| 2003/0009515 A1 | 1/2003 | Lee et al. | |
| 2003/0028270 A1 | 2/2003 | Peterson et al. | |
| 2003/0033028 A1 | 2/2003 | Bennett | |
| 2003/0037166 A1 | 2/2003 | Ueno et al. | |
| 2003/0040812 A1 | 2/2003 | Gonzales et al. | |
| 2003/0040813 A1 | 2/2003 | Gonzales et al. | |
| 2003/0040819 A1 | 2/2003 | Gonzales | |
| 2003/0065407 A1 | 4/2003 | Johnson et al. | |
| 2003/0074088 A1 | 4/2003 | Gonzales | |
| 2003/0083758 A1 | 5/2003 | Williamson | |
| 2003/0101304 A1 | 5/2003 | King et al. | |
| 2003/0198938 A1 | 10/2003 | Murray | |
| 2003/0200009 A1 | 10/2003 | von Kannewurff | |
| 2004/0003051 A1 | 1/2004 | Krzyzanowski et al. | |
| 2004/0004810 A1 | 1/2004 | Kim | |
| 2004/0010327 A1 | 1/2004 | Terashima et al. | |
| 2004/0010561 A1 | 1/2004 | Kim | |
| 2004/0039459 A1 | 2/2004 | Daugherty et al. | |
| 2004/0092282 A1 | 5/2004 | Kim et al. | |
| 2004/0133314 A1 | 7/2004 | Ehlers | |
| 2004/0138768 A1 | 7/2004 | Murray | |
| 2004/0143629 A1 | 7/2004 | Bodin et al. | |
| 2004/0176877 A1 | 9/2004 | Hesse | |
| 2004/0213384 A1 | 10/2004 | Alles | |
| 2004/0215694 A1 | 10/2004 | Podolsky | |
| 2004/0215778 A1 | 10/2004 | Hesse et al. | |
| 2004/0215816 A1 | 10/2004 | Hayes et al. | |
| 2004/0237107 A1 | 11/2004 | Staples | |
| 2004/0243257 A1 | 12/2004 | Theimer | |
| 2004/0249922 A1 | 12/2004 | Hackman | |
| 2004/0260407 A1 | 12/2004 | Wimsatt | |
| 2004/0260427 A1 | 12/2004 | Wimsatt | |
| 2004/0267385 A1 | 12/2004 | Lingemann | |
| 2004/0267876 A1 | 12/2004 | Kakivaya et al. | |
| 2004/0267909 A1 | 12/2004 | Autret | |
| 2005/0009498 A1 | 1/2005 | Ho | |
| 2005/0021805 A1 | 1/2005 | De Petris et al. | |
| 2005/0035717 A1 | 2/2005 | Adamson | |
| 2005/0055108 A1 | 3/2005 | Gonzales | |
| 2005/0071419 A1 | 3/2005 | Lewontin | |
| 2005/0080879 A1 | 4/2005 | Kim et al. | |
| 2005/0085930 A1 | 4/2005 | Gonzales | |
| 2005/0090915 A1 | 4/2005 | Geiwitz | |

| | | | | | | |
|---|---|---|---|---|---|---|
| 2005/0096753 A1 | 5/2005 | Arling et al. | 2005/0267605 A1 | 12/2005 | Lee et al. | |
| 2005/0107897 A1 | 5/2005 | Callaghan | 2005/0271355 A1 | 12/2005 | Gilor | |
| 2005/0108091 A1 | 5/2005 | Sotak | 2006/0004920 A1 | 1/2006 | Hallenbeck | |
| 2005/0113021 A1 | 5/2005 | Gosieski, Jr. et al. | 2006/0009861 A1 | 1/2006 | Bonasia et al. | |
| 2005/0113943 A1 | 5/2005 | Nian | 2006/0020353 A1 | 1/2006 | Gonzales et al. | |
| 2005/0119767 A1 | 6/2005 | Kiwimagi et al. | 2006/0053234 A1 | 3/2006 | Kumar et al. | |
| 2005/0119793 A1 | 6/2005 | Amundson et al. | 2006/0058900 A1 | 3/2006 | Johanson et al. | |
| 2005/0125083 A1 | 6/2005 | Kiko | 2006/0106933 A1 | 5/2006 | Huang et al. | |
| 2005/0131551 A1 | 6/2005 | Ruutu | 2006/0118694 A1* | 6/2006 | Lee et al. | 248/923 |
| 2005/0131553 A1 | 6/2005 | Yoon et al. | 2006/0126646 A1 | 6/2006 | Bedingfield, Sr. | |
| 2005/0131558 A1 | 6/2005 | Braithwaite | 2006/0155802 A1 | 7/2006 | He et al. | |
| 2005/0132405 A1 | 6/2005 | AbiEzzi | 2007/0053376 A1 | 3/2007 | Oshima et al. | |
| 2005/0149758 A1 | 7/2005 | Park | 2007/0083679 A1 | 4/2007 | Kikuchi | |
| 2005/0159823 A1 | 7/2005 | Hayes et al. | 2007/0104332 A1 | 5/2007 | Clemens et al. | |
| 2005/0198063 A1 | 9/2005 | Thomas et al. | 2007/0153459 A1* | 7/2007 | Wohlford et al. | 361/681 |
| 2005/0198188 A1 | 9/2005 | Hickman | 2007/0247800 A1* | 10/2007 | Smith et al. | 361/683 |
| 2005/0198304 A1 | 9/2005 | Oliver et al. | 2008/0108439 A1* | 5/2008 | Cole | 463/46 |
| 2005/0232583 A1 | 10/2005 | Kubota | 2009/0032010 A1* | 2/2009 | Hoffmeier | 126/198 |
| 2005/0262227 A1 | 11/2005 | Heller et al. | | | | |

* cited by examiner

AIR-COOLING SYSTEM CONFIGURATION FOR TOUCH SCREEN

CROSS REFERENCE TO RELATED APPLICATION

This application claims priority to and the benefit of U.S. Provisional Patent Application No. 60/747,726 filed on May 19, 2006, entitled COOLING DEVICE FOR A TOUCH SCREEN AND THE LIKE, which is hereby expressly incorporated by reference for all purposes as if fully set forth herein.

BACKGROUND OF THE INVENTION

1. Field of the Invention

The invention is directed generally to cooling electronic devices and, more particularly, to an air-cooling system configuration for electronic devices arranged at places where sufficient cooling/exhaust air movement is not readily available, such as wall mounted touch screens or other electronic displays.

2. Related Art

It is widely known and recognized in the electronics industry that heat dissipation is a serious consideration in the design and operation of electronic devices. This is especially true for densely packaged electronic circuit components and in particular integrated circuit (IC) components together with printed circuit boards (PCB). It is known, for example, that to operate IC components at full power capability, there should be no or very little temperature difference between the IC components and ambient air. To achieve this, various techniques have been applied to cooling of the IC components, including blowing cooling air over the IC components. However, in many applications where forced air may be available, it may not be used because the amount of air is limited or insufficient, or enough space to implement an air-cooling system may not be available without elaborate structural reconfiguration.

Consumer electronic devices, for example, flat panel display devices such as a liquid crystal display (LCD), plasma monitors/television sets and the like, are typically stand alone type devices that are allowed to freely intake air from their surroundings to cool the internal IC components and PCBs, and hence are usually configured such that they do not have an internal cooling system. However, when these devices are situated where the amount of intake air is limited or insufficient and/or not enough space is readily available for implementing a proper cooling system, heat will build up and the device performance and life span often will be adversely affected.

In this same regard, it has become a trend for consumer electronic devices to become part of a building's structure including the mounting of televisions or other displays to a wall surface, and the like. Being in close association with the building structure creates additional disadvantages in the area of cooling the device. For example, when a flat panel display is mounted on or inserted in a compartment formed in a wall, the majority of its rear side where major ventilation and heat dissipation occur is blocked, thereby increasing the internal temperature.

With the advent of higher-end, faster operating, and more complex electronic devices, there is a need to cool these devices in a way that was not previously contemplated by either the stand alone devices or the other prior art approaches. Accordingly, there is a need for an efficient air-cooling system configuration for electronic devices used in situations where a sufficient amount of air is not readily available for heat dissipation, such as wall-mounted devices.

SUMMARY OF THE INVENTION

The invention meets the foregoing need and provides sufficient cooling of electronic devices despite confining arrangements and/or a limited cooling-air source for proper heat dissipation, such as wall-mounted devices and that furthermore includes other advantages apparent from this discussion herein.

Accordingly, in one aspect of the invention, a cooling system for an electrical device includes a receptacle unit having a main opening with an inner chamber, a cooling unit operably associated with the electrical device and arranged in the chamber of the receptacle unit, intake and exhaust openings arranged between the electronic device and the receptacle unit, an intake path extending from the intake opening to the cooling unit via the chamber of the receptacle unit and an exhaust path extending from the cooling unit to the exhaust opening via the inner space of the receptacle unit.

According to another aspect of the invention, a cooling system for an electronic device includes means for cooling the electronic device, means for receiving the electronic device, the cooling means being in an enclosed spaced having limited airflow, means for providing cooling air to the cooling means in the receiving means, means for removing exhaust air from the cooling means, and means for separating the providing means and the removing means.

In yet another aspect of the invention, a method of cooling an electronic device arranged in an enclosed space having limited air flow, the electronic device having a cooling unit associated therewith, includes intaking cooling air from outside the electronic device to the cooling unit, cooling the electronic device using the cooling air, and expelling the exhaust air generated by heat of the electronic device from the electronic device, and separating the exhaust air from the cooling air.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the several views of the drawings.

Figure 1:
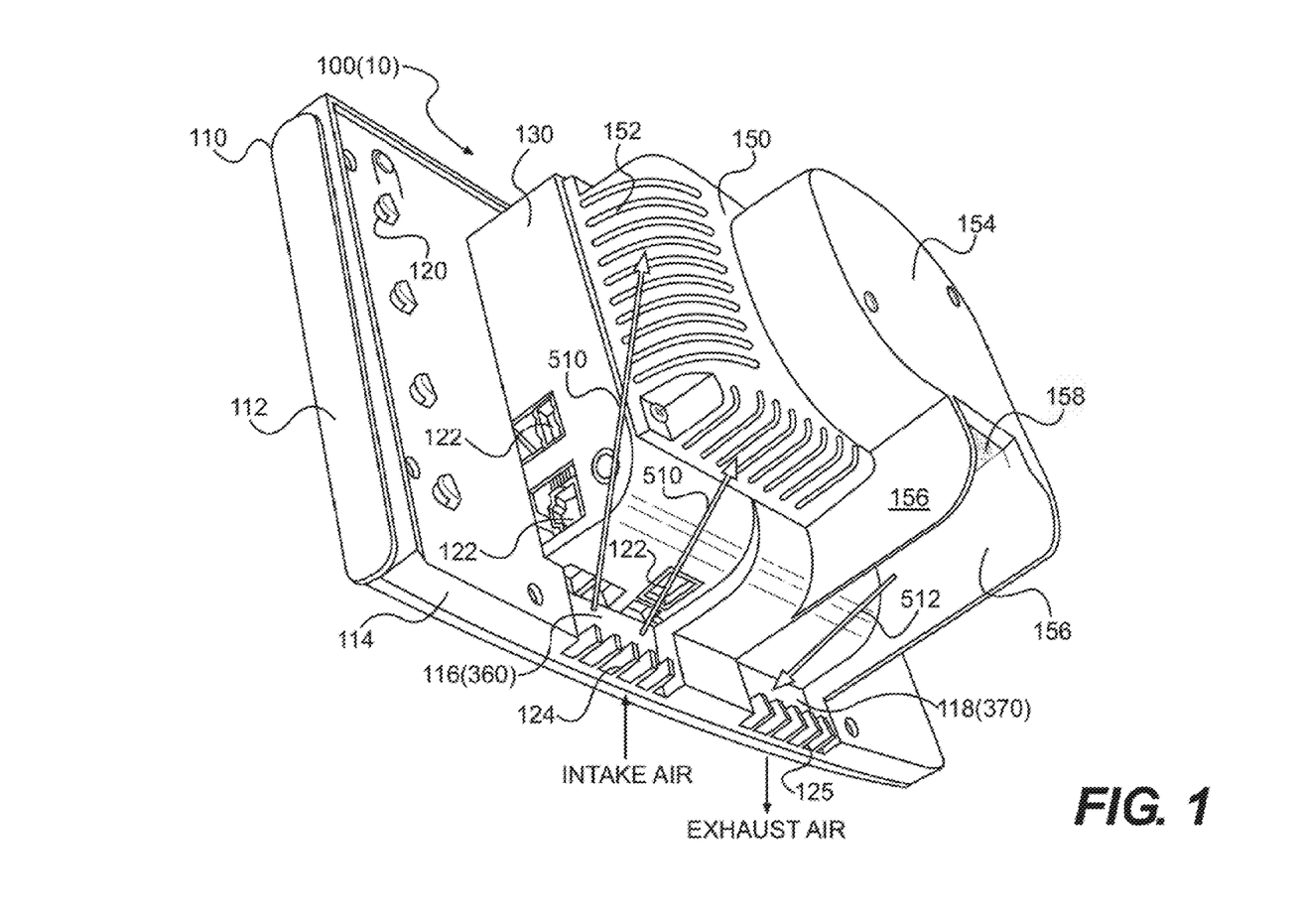
FIG. 1 shows a rear perspective view of an assembly of a wall-mountable flat panel display and cooling unit of an air-cooling system configuration constructed according to the principals of the invention.

FIG. 1 shows an assembly 100 of an electronic device 110 and a cooling unit 150, which may be a part of an air-cooling system 10. The air-cooling system 10 may further include a receptacle unit 300 shown in FIG. 3, which may be joined together with the assembly 100 as shown in FIG. 4. Upon being joined together, the assembly 100 and receptacle unit 300 may be configured to ensure sufficient air intake for the electronic device 110 even when the electronic device 110 is situated where sufficient air intake may not readily be available due to building, wall, or other structural components, such as when the electronic device 110 is mounted in a wall.

In an embodiment, the electronic device 110 may be a flat panel display device (e.g., LCD or plasma monitor or television set or the like). For example, the electronic device 110 may be a touch screen device that may be installed on or in a wall and configured to display information on its screen and receive instructions from a user by sensing the location on the screen touched by the user. The touch screen device 110 may be used to control a convergence and automation system, which is described in Applicants' co-pending U.S. patent application Ser. No. 11/738,305, filed on Apr. 20, 2007, entitled TOUCH SCREEN FOR CONVERGENCE AND AUTOMATION SYSTEM, which is hereby expressly incorporated by reference for all purposes as if fully set forth herein. Of course, the invention contemplates any other type of electronic device for use with the air-cooling system and configuration described herein including, but not limited to, computer systems, audio systems, video systems, or the like.

The touch screen 110 may include a front frame 112 and rear frame 114 joined to the front frame 112 with an LCD panel 20 (shown in FIG. 5) and driving circuitry 30 (shown in FIG. 5) therebetween. The driving circuitry 30 may be a printed circuit board (PCB) containing a number of IC components, which may require proper heat dissipation to ensure a normal operation. The PCB may be arranged at a center portion of the rear surface of the LCD panel 20. The front frame 112 may have a main opening 113 (shown in FIGS. 4 and 5) exposing a screen 22 (shown in FIGS. 4 and 5) of the LCD panel 20 on the front surface of the touch screen 110. The rear frame 114 may have a rear compartment 130 to house various components including the driving circuitry 30. The rear compartment 130 may protrude from a rear surface of the rear frame 114 and may have one or more openings or slots (not shown) exposing the driving circuitry 30 to the cooling unit 150 which may be fixedly mounted thereon. The rear compartment 130 may have various connectors 122 connected to various components of the touch screen device 110. For example, the various connectors 122 may be a power connector, network cable connector, USB connector and the like. Also, the assembly 100 may have structures formed on an edge thereof for cooling air entry to and exhaust air exit from the air-cooling system 10. For example, FIG. 1 shows recessed portions 116 and 118 formed at the bottom edge of the rear frame 114, which may constitute an intake port 360 and an exhaust port 370, respectively, when the assembly 100 is conjoined with the receptacle unit 300 shown in FIG. 3, which will be explained below in detail. The recessed portions 116 and 118 may be provided with fins 124 and 125, respectively, to direct a stream of air in desired directions, which will be explained later in detail. Upon conjoining the assembly 100 to the receptacle unit 300, intake and exhaust paths 510, 520 may be formed. The Intake path 510 may extend from the recessed portion 116 to the cooling unit 150, and the exhaust path 520 path extend from the cooling unit 150 to the recessed portion 118.

The cooling unit 150 may be arranged adjacent to the electronic device 110 for cooling the internal components that may generate heat under the normal operation. For example, as shown in FIG. 1, the cooling unit 150 may be fixedly mounted on the rear compartment 130, which may be configured to house the driving circuitry 30 and other components that may generate heat under a normal operation. As shown in FIG. 1, the cooling unit 150 may include a blower fan 40 (shown in FIG. 5), such as a squirrel cage type fan or other fan known in the art, and may include a plurality of slots 152 to receive the cooling air into a fan compartment 154 configured to house the blower fan 40 therein. The blower fan 40 may direct the cooling air entering the cooling unit 150 via the slots 152 to the rear compartment 130 for cooling down the driving circuitry 30 and other internal components therein. Although FIG. 1 particularly shows the cooling unit 150 being a blower fan, it should be noted that any type of device that can provide directed cooling air to the electrical device 110 is contemplated by the invention. Also, the blower fan 40 may be dynamically controlled based on a sensed temperature or amount of heat generated by the electronic device 110. The cooling unit 150 may further include guide walls 156 and an exhaust opening 158. The exhaust opening 158 may be arranged proximate the rear compartment 130 such that a stream of the exhaust air may be directed toward the outside the cooling unit 150, thereby isolating the exhaust path 520 from the intake path 510. The guide walls 156 may be extended from the exhaust opening 158 to guide the exhaust air toward the recessed portion 118 of the assembly 100. The guide walls 156 may be configured such that the exhaust air exiting from the cooling unit 150 via the exhaust opening 158 may be separated from and not mixed with the cooling air entering to the cooling unit 150 via the recessed portion 116 and slots 152.

Figure 2:
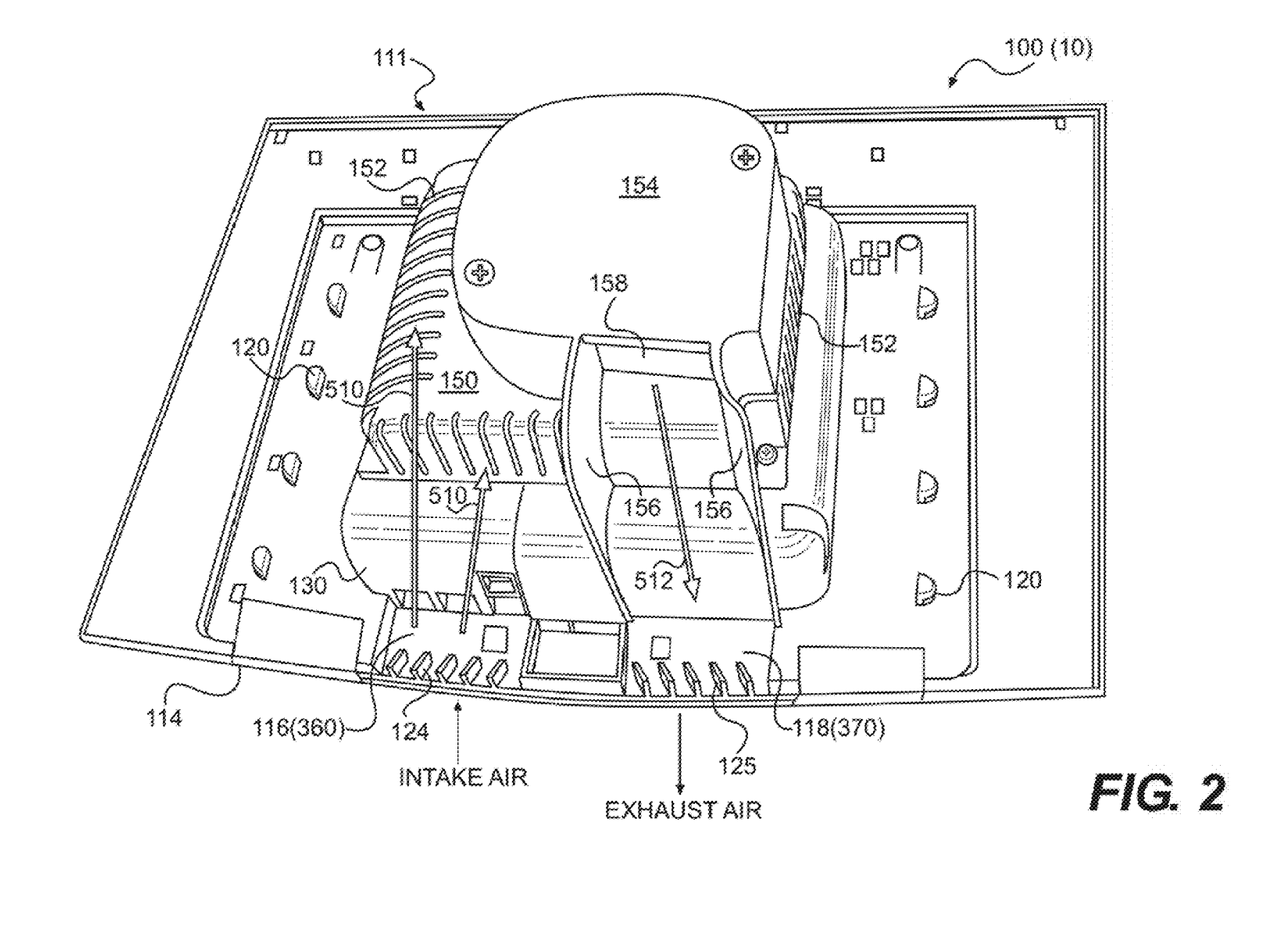
FIG. 2 shows a rear view of an assembly of a larger flat panel display and the cooling unit of FIG. 1.

In order to mount the assembly 100 to the receptacle unit 300 in a stable manner, the air-cooling system 10 may be implemented with a locking structure. For example, as shown in FIGS. 1 and 2, keys 120 (note only two are referenced, but more are shown) may be formed on the rear frame 114 of the electronic device 110. The keys 120 may be located at predetermined locations corresponding to keyhole slots 335 (see FIG. 3) of the receptacle unit 300 such that the assembly 100 may be detachably fixed to the receptacle unit 300 through locking interaction between the keys 120 and keyhole slots 335, which is well known in the art. Although FIGS. 1 and 3 particularly show the keys 120 and keyhole slots 335 as the locking structure, it should be noted that any type of locking structure or method that may provide stable locking is contemplated by the invention.

The receptacle unit 300 may be configured so that the electronic device 110 may house another device which may have a different size and configuration. For example, FIG. 2 shows a larger touch screen display 111 having the same arrangement of the keys 120 of the touch screen display 110 of FIG. 1 so that the larger touch screen display 111 may also be used in the receptacle unit 300. As shown therein, the rear frame 114 of the touch screen display 111 may be configured such that the keys 120 may be positioned at the same locations as they are positioned on the touch screen display 110 of FIG. 2 to ensure that both may be attached to the receptacle unit 300. Such configuration may ensure that the receptacle unit 300 may be universally used regardless of the size and configuration of the electronic devices which may be replaced for various reasons such as upgrade, replacement, maintenance and the like.

Figure 3:
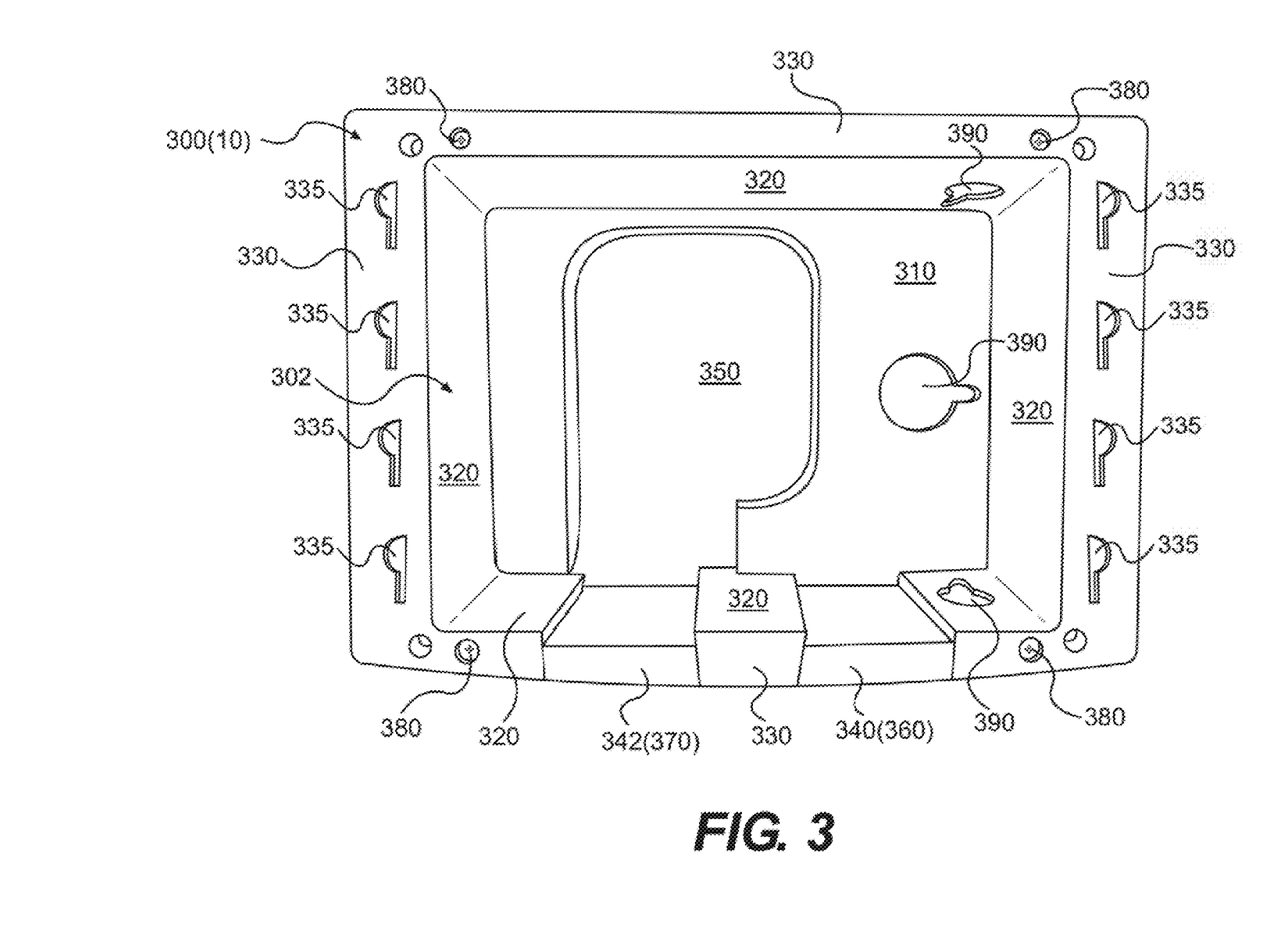
FIG. 3 shows a front view of a receptacle unit for use with of the air-cooling system configuration of FIG. 1.
Figure 4:
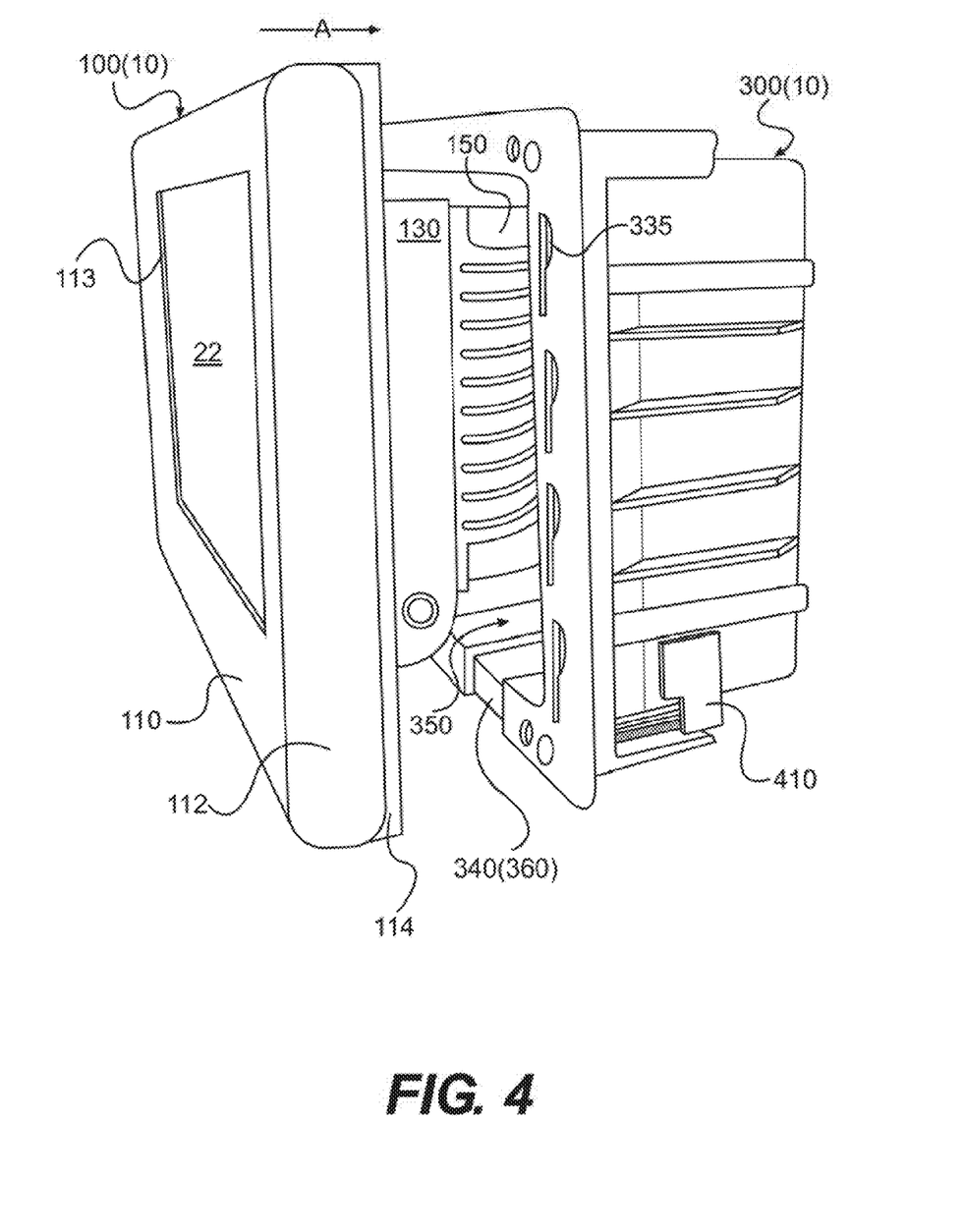
FIG. 4 shows the assembly of FIG. 1 partially inserted into the receptacle unit of FIG. 3.

In particular, FIG. 3 shows the receptacle unit 300 that may be configured to receive the assembly 100 shown in FIG. 1 to provide enhanced cooling. The receptacle unit 300 may include a main opening 302 exposing an inner space 350, which may be surrounded by a rear wall 310 and side walls 320. A rim 330 may be formed, extending from the side walls 320, to surround the main opening 302 of the receptacle unit 300. The keyhole slots 335 may be formed at the rim 330 corresponding to the keys 120 formed on the assembly 100 shown in FIGS. 1 and 2 such that the assembly 100 may be fixedly attached to the receptacle unit 300 in a stable manner.

Similar to the assembly 100, the receptacle unit 300 may include structures formed on an edge thereof for cooling air entry to and exhaust air exit from the air-cooling system 10. For example, as shown in FIG. 3, recessed portions 340 and 342 may be formed at the rim 330 corresponding to the recessed portions 116 and 118 of the assembly 100, respectively, such that when the assembly 100 is joined to the receptacle unit 300, a combination of the recessed portions 116 and 340 may form the intake port 360 for the cooling air entry. Similarly, a combination of the recessed portions 118 and 342 may form the exhaust port 370 for the exhaust air exit. The fins 124 and 125 shown in FIG. 1 may be formed either on the assembly 100 or receptacle unit 300. As shown in FIG. 2, the fins 124 may be configured such that the cooling air entering through the intake port 360 may be directed to the slots 152 of the cooling unit 150 while preventing the exhaust air exiting from the exhaust port 370 from re-entering to the intake port 360. Also, the grill 125 may be configured to direct the exhaust air away from the intake port 360 such that the exhaust air is prevented from re-entering to the intake port 360.

As shown in FIG. 3, the recessed portions 340 and 342 may be further extended along the sidewall 320 toward the rear wall 310 to increase the amount of cooling/exhaust air moving toward/from the cooling unit 150. Also, the recessed portion 342 connected to the exhaust port 370 may be covered by the guide walls 156 of the cooling unit 150 such that the exhaust air from the cooling unit 150 may not be mixed with the cooling air entering through the intake port 360 within the inner space 350 of the receptacle unit 300. Moreover, the receptacle unit 300 may include a wire hole 390 to allow for wires, such as power and/or data lines, to extend into the receptacle unit 300 for connection to the assembly 100.

In particular, as shown in FIG. 4, the receptacle unit 300 may be configured such that the rear compartment 130 and the cooling unit 150 of the assembly 100 may be received in the inner space 350 thereof. Also, the receptacle unit 300 may be configured such that a portion of the inner space 350 near the intake port 360 may function as a cooling air intake path between the intake port 360 and the slots 152 of the cooling unit 150. Furthermore, another portion of the inner space 350 near the exhaust port 370 may function as an exhaust path between the exhaust opening 158 of the cooling unit 150 and the exhaust port 370. As mentioned above, the exhaust path may be separated from the intake path by the guide walls 158, which may be formed either at the assembly 100 as shown in FIGS. 1 and 2 or at the receptacle unit 300.

FIG. 4 further shows the assembly 100 and receptacle unit 300 being joined together. As shown therein, the rear compartment 130 and the cooling unit 150 of the assembly 100 may be inserted into the inner space 350 of the receptacle unit 300 in the direction A and the keys 120 and keyhole slots 335 may be engaged to attach the assembly 100 to the receptacle unit 300. Upon the engagement, the recessed portions 116 and 342 may be joined to each other to form the intake port 360, and the recess portion 118 and 342 may be joined each other to form the exhaust port 370. Moreover, the electronic device 100 may be flush with a mounting surface covering the receptacle unit 300.

The receptacle unit 300 may be mountable in a wall of a house, business space, boat, luxury vehicle, academic space, and the like. For example, the receptacle unit 300 may be inserted into an opening in the wall or may be fixed on the wall using one or more fastening structures. For example, the receptacle unit 300 may include holes 380 formed on the rim 330 as shown in FIG. 3 in order to fix the rim 330 on the wall using screws, nails, or the like. When the receptacle unit 300 is fixed on the wall, the intake port 360 and the exhaust port 370 are exposed to room air although they may not be easily visible by the user. Simultaneously or alternatively, the receptacle unit 300 may be inserted into a hole or other aperture in the wall and held with a structure 410 such that when the receptacle unit 300 is inserted into the wall opening, such as a rectangular opening, the structure 410 may be used to secure the receptacle unit 300 in the wall. In one particular embodiment, the structure 410 may include a pivoting paddle structure and screw mechanism. After inserting the receptacle unit 300 in the wall opening, turning the screw mechanism of the structure 410 may cause the paddle of the structure 410 to rotate and travel toward the inside or back part of the wall structure. Once the receptacle unit 300 has been inserted into a wall, the assembly 100 device 102 can be inserted into the receptacle unit 300 as shown in FIG. 4.

Figure 5:
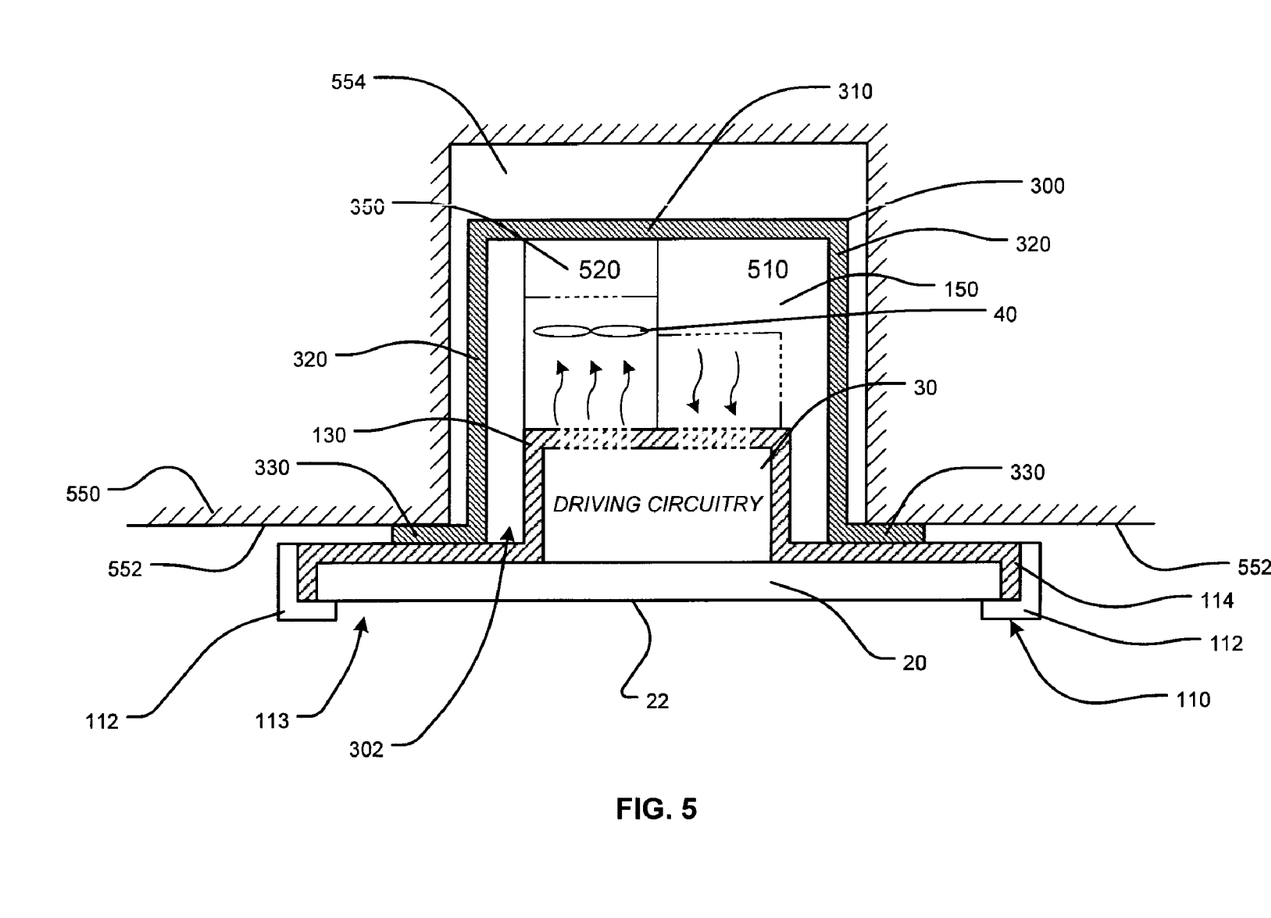
FIG. 5 shows the receptacle unit shown in FIG. 3 mounted in a wall and the touch screen shown in FIG. 1 fully inserted into the receptacle unit.

FIG. 5 shows the receptacle unit 300 mounted in a wall 550, and the touch screen 110 inserted unit the receptacle unit 300. The wall 550 may have a recess 554 and a mounting surface 552 surrounding the recess 554. The recess 554 may be large enough to receive the receptacle unit 300 entirely except for the rim 330. The rim 330 of the receptacle unit 200 may contact the mounting surface 552 of the wall 550. As mentioned above, one or more fastening structures may be used to fix the rim 330 to the mounting surface 552. The touch screen 110 may be inserted into the inner space 350 of the receptacle unit 300 via an opening 302 of the receptacle unit 300 exposing the inner space 350 thereof. As shown in FIG. 5, the inner space 350 may be surrounded by the rear wall 310 and side walls 320 of the receptacle unit 300.

The touch screen 110 may include the LCD panel 20, driving circuitry 30, cooling unit 150, front frame 112, rear frame 114 and/or the like. The LCD panel 20 may have the screen 22 or the front side thereof. The driving circuitry 30 may be arranged on the rear side of the LCD panel 20. The front and rear frames 112, 114 may be conjoined to fix the LCD panel 20 and driving circuitry 30 therebetween. The driving circuitry 30 may be covered by the rear compartment 130. The cooling unit 150 may be arranged on the rear compartment 130 to take heat generated from the driving circuitry 30. The cooling unit 150 may include the fan 40 which may receive the intake air via the intake path 510 (shown in FIGS. 1 and 2) for cooling the driving circuit 30. The exhaust air from the fan 40 may exit the cooling unit 150 via the exhaust path 520 (shown in FIGS. 1 and 2).

As mentioned above, according to the invention, the intake and exhaust ports 360 and 370 are exposed to room air such that a constant stream of the cooling air may be provided to the cooling unit 150 while the exhaust air may be removed from the air-cooling system 10. Thus, even when the electronic device 110 is installed at places where movement of the cooling and exhaust air is substantially obstructed, the invention ensures a flow of the cooling and exhaust air to/from the electronic device 110, thereby avoiding any malfunctions thereof due to an elevated temperature therein and the like.

Moreover, the intake and exhaust ports 360 and 370 may be discreetly arranged on the air cooling system 10 such that the air is brought into and exhausted from the electronic device 110 at locations below the device thus making a more attractive front surface of the electronic device 110. Of course, the particular location of the intake and exhaust ports 360 and 370 described hereinabove is merely exemplary. In this regard, the intake and exhaust ports 360 and 370 may be arranged at any position on the receptacle 300.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. A cooling system for an electrical device comprising:
   a receptacle unit having an inner chamber and a main opening exposing the inner chamber;
   a cooling unit operably associated with the electrical device and arranged in the inner chamber of said receptacle unit;
   intake and exhaust openings arranged between the electronic device and said receptacle unit;
   an intake path extending from said intake opening to said cooling unit via the inner chamber of said receptacle unit; and
   an exhaust path extending from said cooling unit to said exhaust opening via the inner chamber of said receptacle unit,
   wherein the electrical device comprises:
      a flat panel display device having a screen on a front side thereof;
      a driving circuit arranged on a rear surface of said flat panel display device and
      a frame receiving the flat panel display device and driving circuit, said frame comprising:
         a front frame having an opening exposing the screen of the flat panel display device; and
         a rear frame engaged with said front frame to receive the flat panel display therebetween, said rear frame having first and second recessed portions arranged at an edge thereof,
   wherein said receptacle unit comprises:
      a rear wall and side walls surrounding the inner chamber of said receptacle unit; and
      a rim extending from the side walls and surrounding the main opening of said receptacle unit and configured to contact a mounting surface, said rim comprising third and fourth recessed portions arranged corresponding to the said first and second recessed portions, respectively.

2. The cooling system of claim 1, wherein said cooling unit comprises a cooling fan and a housing covering said cooling fan.

3. The cooling system of claim 2, wherein said housing comprises:
   a plurality of intake slots connected to said intake path; and
   at least one exhaust opening connected to said exhaust path.

4. The cooling system of claim 3, wherein said housing further comprises an exhaust guide disposed along said exhaust path.

5. The cooling system of claim 4, wherein said exhaust guide is configured to separate said exhaust path from said intake path in the inner space of said receptacle unit.

6. The cooling system of claim 1, wherein said rear frame further comprises fins arranged in at least one of the first and second recessed portions.

7. The cooling system of claim 1, wherein said first and second recessed portions are arranged at a bottom edge of said rear frame.

8. The cooling system of claim 1, wherein said rear frame comprises a rear compartment to protrude from a rear surface thereof and configured to cover at least said driving circuit.

9. The cooling system of claim 8, wherein said compartment is arranged on a center portion of the rear surface of said rear frame.

10. The cooling system of claim 8, wherein said cooling unit is mounted on said rear compartment.

11. The cooling system of claim 1, further comprising fins arranged in either the first and second recessed portions or the third and fourth recessed portions.

12. The cooling system of claim 1, further comprising an engagement mechanism configured to detachably fix the electrical device to said receptacle unit.

13. The cooling system of claim 12, wherein said engagement mechanism comprises a plurality of keys formed at said rear frame and a plurality of keyhole slots formed at the said receptacle unit.

14. The cooling system of claim 1, wherein said receptacle unit is configured to be mounted in a wall.

15. The cooling system of claim 14, wherein said receptacle unit further includes a fastening structure configured to contact the wall.

16. The cooling system of claim 1, wherein said cooling unit is connected to said electronic device.

17. The cooling system of claim 1, wherein said electrical device is detachably fixed to said receptacle unit.

18. The cooling system of claim 1, wherein said intake and exhaust openings are formed by attachment of the electrical device and said receptacle unit.

19. An apparatus comprising:
   a receptacle unit mountable on a wall, comprising:
      a wall structure surrounding an inner space thereof;
      a main opening exposing the inner space; and
      a rim extended from the wall structure to surround the main opening and comprising first and second recessed portions;
   a display device detachably engaged to the receptacle unit, comprising:

a flat panel display device having a screen on a front surface thereof;

a driving circuit configured to control the flat panel display device;

a frame configured to fix the driving circuit on a rear side of the flat penal display device, the frame comprising third and fourth recessed portions arranged corresponding to the first and second recessed portions at an edge thereof; and a cooling unit attached to the frame to exhaust heat generate from the driving circuit;

an intake opening formed by a combination of the first and third recessed portions;

an exhaust openings formed by a combination of the second and fourth recessed portions;

an intake path extending from the intake opening to the cooling unit via the inner space of the receptacle unit; and an exhaust path extending from the cooling unit to said exhaust opening via the inner space of said receptacle unit.

20. The apparatus of claim 19, wherein the cooling unit comprises a cooling fan and a housing covering the cooling fan.

21. The apparatus of claim 20, wherein the housing comprises:

a plurality of intake slots connected to the intake path; and at least one exhaust opening connected to the exhaust path.

22. The apparatus of claim 21, wherein the housing further comprises an exhaust guide disposed along the exhaust path and configured to separate the exhaust path from the intake path within the inner space of the receptacle unit.

23. The apparatus of claim 19, wherein the frame comprises:

a front frame having an opening exposing the screen of the flat panel display device; and a rear frame engaged with the front frame to fix the flat panel display device and the driving circuit therebetween.

24. The apparatus of claim 23, wherein the third and fourth recessed portions are arranged at an edge of the rear frame.

25. The apparatus of claim 23, wherein the rear frame comprises a rear compartment protruded from a rear surface thereof and configured to cover at least the driving circuit.

26. The apparatus of claim 25, wherein the cooling unit is mounted on the rear compartment.

27. The apparatus of claim 19, wherein the receptacle unit further comprises a plurality of fins arranged in at least one of the third and fourth recessed portion.

28. The apparatus of claim 19, further comprising an engagement mechanism configured to detachably fix the electrical device to the receptacle unit.

29. The apparatus of claim 28, wherein the engagement mechanism comprises:

a plurality of keys formed at one of the rear frame and the receptacle unit; and a plurality of keyhole slots formed at another one of the rear frame and the receptacle unit.

30. The apparatus of claim 19, wherein the receptacle unit further comprises a fastening structure to fix the receptacle unit to a wall.

* * * * *